United States Patent [19]

Smith, Jr.

[11] 3,854,342

[45] Dec. 17, 1974

[54] RADIO TUNING APPARATUS

[75] Inventor: Robert T. Smith, Jr., Southampton, Pa.

[73] Assignee: Philco-Ford Corporation, Blue Bell, Pa.

[22] Filed: Dec. 12, 1973

[21] Appl. No.: 424,098

[52] U.S. Cl. .................. 74/10.5, 74/10.33, 74/10.8, 325/471, 334/19

[51] Int. Cl. .............................................. F16h 35/18

[58] Field of Search ............. 74/10.33, 10.85, 10.90, 74/10.5, 128, 10.27, 10.8; 325/471, 468; 334/18, 19, 20

[56] References Cited

UNITED STATES PATENTS

| | | | |
|---|---|---|---|
| 2,511,580 | 6/1950 | Goodrich, Jr. | 334/19 |
| 2,751,503 | 6/1956 | Schwarz | 334/19 |
| 2,857,519 | 10/1958 | Gaskill et al. | 334/19 |
| 2,877,351 | 3/1959 | Sacre | 325/471 |

*Primary Examiner*—Samuel Scott
*Assistant Examiner*—Randall Heald
*Attorney, Agent, or Firm*—Robert D. Sanborn; Harry W. Hargis, II

[57] ABSTRACT

Radio receiving apparatus having an adjustable search tuner operable over a predetermined band of frequencies, and drive means for moving the tuner at a relatively slow rate for search tuning in one direction of travel, and at a relatively rapid rate for repositioning in the opposite direction. The drive means comprises a tuner drive shaft, a unidirectionally rotatable motor, a lever, and first and second solenoid means coupled with the lever, each selectively energizable to rock the lever in one or the other direction. First and second drive wheel means of different diameters are driven with the motor and are mounted for rotation on the lever. Energization of the first solenoid means rocks the lever in one direction to effect slow tuner drive coupling between the first drive wheel means and the tuner drive shaft. Energization of the second solenoid means rocks the lever in the other direction to effect rapid tuner drive coupling between the second drive wheel means and the tuner drive shaft.

11 Claims, 5 Drawing Figures

RADIO TUNING APPARATUS

BACKGROUND OF THE INVENTION

This invention relates to radio tuning apparatus, and more particularly to improved means for driving a radio search tuner at a relatively slow rate for searching in one direction, and for driving the tuner at a relatively rapid rate for repositioning in the opposite direction.

One well known apparatus of the foregoing type comprises an automobile radio receiver of the kind incorporating a so-called "stop-on-signal" search tuning system. In such a system, a tuning carriage is caused to move automatically, upon initiation by an operator, to search for the strongest radio signal in a particular area. Upon receiving such a signal, the tuning carriage will be halted in its travel, consequently tuning-in the station. Should the tuning carriage reach the end of the tuning band without a station having been located, the tuning carriage will be automatically returned, at a relatively rapid rate, to the opposite end of the tuning band where it will stand repositioned for an ensuing search operation.

It is a general objective of the present invention to provide an improved search-tune drive mechanism featured by simplicity of construction and by capability of ready assembly with tuning mechanism of otherwise conventional construction.

SUMMARY OF THE INVENTION

In achievement of the foregoing as well as other objectives and advantages, the invention contemplates the provision, in radio receiving apparatus having adjustable means for tuning over a predetermined band of frequencies, of improved drive means for moving said tuning means at a relatively slow rate in one direction of travel for search tuning and at a relatively rapid rate in the opposite direction for repositioning, which drive means comprises: a unidirectionally rotatable motor; a lever; first and second solenoid means coupled with said lever, each selectively energizable to rock said lever in one or the other direction; first and second drive wheel means, of different diameters, driven with said motor; and means operable by said lever to effect a relatively slow drive coupling between said first drive wheel means and said tuning means upon energization of said first solenoid means to rock said lever in one direction, and to effect a relatively rapid drive coupling between said second drive wheel means and said tuning means upon energization of said second solenoid means to rock said lever in the other direction.

The manner in which the foregoing as well as other general objectives and advantages of the invention may best be achieved and will be more fully understood from a consideration of the following description taken in light of the accompanying drawing.

DESCRIPTION OF THE PREFERRED EMBODIMENT

Figures 1, 2:
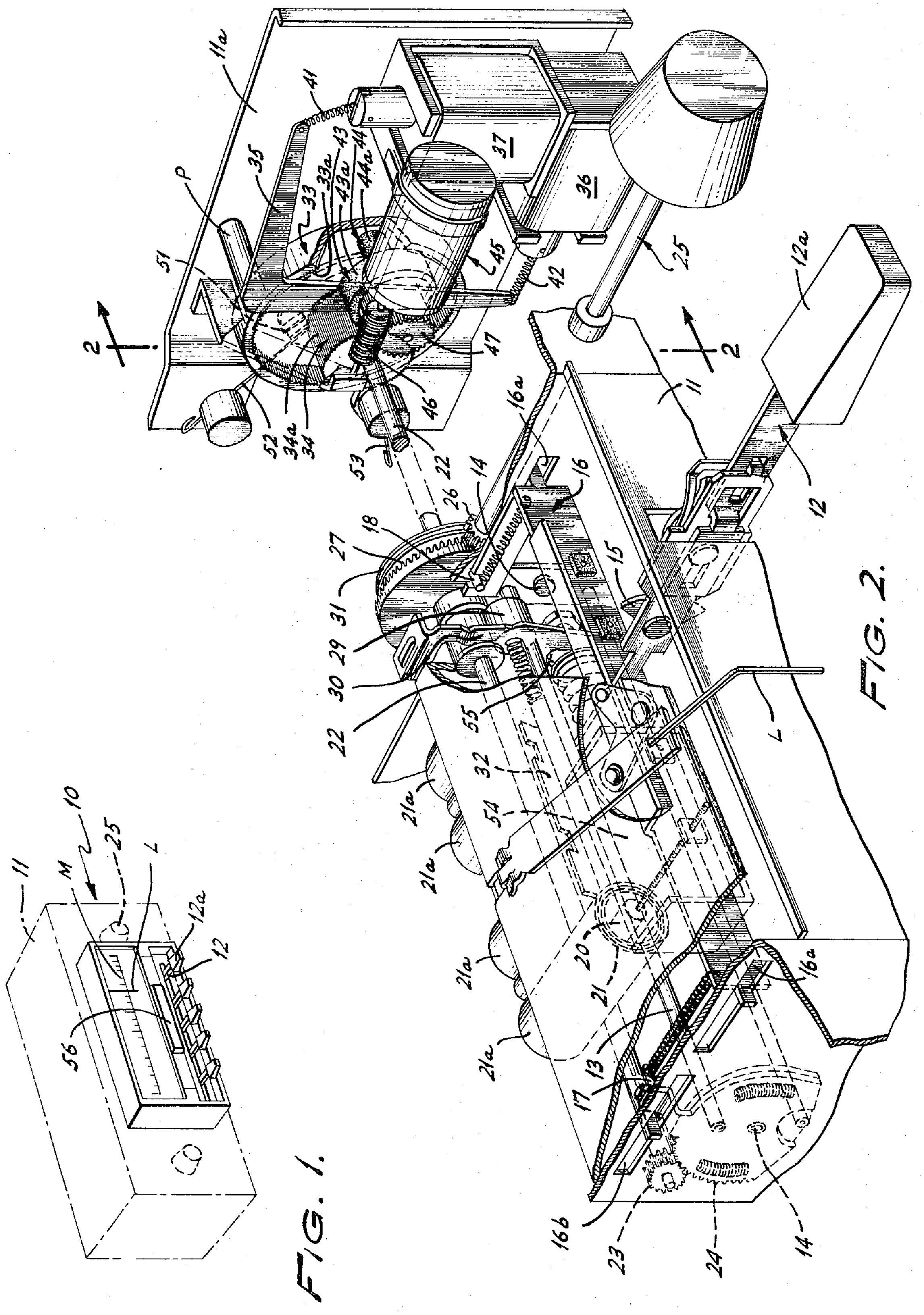
FIG. 1 is a perspective showing of radio apparatus including a tuner drive embodying the invention.
FIG. 2 is a partially exploded, perspective view of the apparatus seen in FIG. 1, but on a larger scale and with portions removed or fragmented for convenience of illustration of the tuner drive.

With more detailed reference to the drawing, and first to FIGS. 1 and 2, a radio receiver 10 includes a frame structure designated generally by the numeral 11 and which supports slides 12 actuatable, by pushbutton 12*a*, between the illustrated extended position and a retracted operative position.

With more detailed reference to FIG. 2, a treadle bar 13 is operable by slides 12, only one of which is shown for convenience of illustration. Treadle bar 13 is rotatable about pivots 14 on frame structure 11, which conveniently may be formed from sheet metal of suitable thickness to ensure its rigidity. A Cam 15 is provided on each of slides 12, and is positioned operably to engage treadle bar 13, upon rearward movement of a slide in response to manual pressure on a pushbutton 12*a*. Slides 12 are returned and held in their extended positions by suitable spring means (not shown) of otherwise conventional design.

A core carriage 16 is mounted for sliding movements in slots 16*a*, 16*b* on frame 11 extending in the direction of movement of the pushbutton slides 12. Carriage 16 is moved by treadle bar 13 through linkage means including pin-and-slot interconnections 17, 18 between the core carriage and treadle bar. Coil cores, one of which is seen at 20, are affixed to carriage 16 by suitable known means, so that the cores extend into coil forms 21 disposed in shield means 21*a*, in the direction of movement of carriage 16. The cores 20 and coils wound about coil forms 21 comprise variable permeability tuning elements for an AM broadcast band radio receiver. A pointer L, operable in known manner by carriage 16, is movable across dial M (FIG. 1) in upscale and down-scale directions.

In addition to drive by slides 12 and their associated cams 15, treadle bar 13 may be driven by a tuner drive shaft 22 through a spur gear 23 on the shaft meshed with a sector gear 24 on treadle bar 13. One mode of rotating tuner drive shaft 22 is by a manual knob and shaft assembly 25 provided with a spur gear 26 meshed with a crown gear 27 coupled with tuner drive shaft 22 through a clutch 31 of conventional design and operable to declutch the manual assembly upon operation of a pushbutton slide 12. In this latter conventional arrangement, each slide 12 is so constructed that upon its movement to retracted position it cammingly engages and pivots a rotatable declutching bar 32 provided with an edge-cam 29. A lever 30 is linked to the operating plate of clutch 31, and is operable by edge cam 29 to declutch tuner drive shaft 22 from crown gear 27 upon operation of a slide 12.

Figure 3:
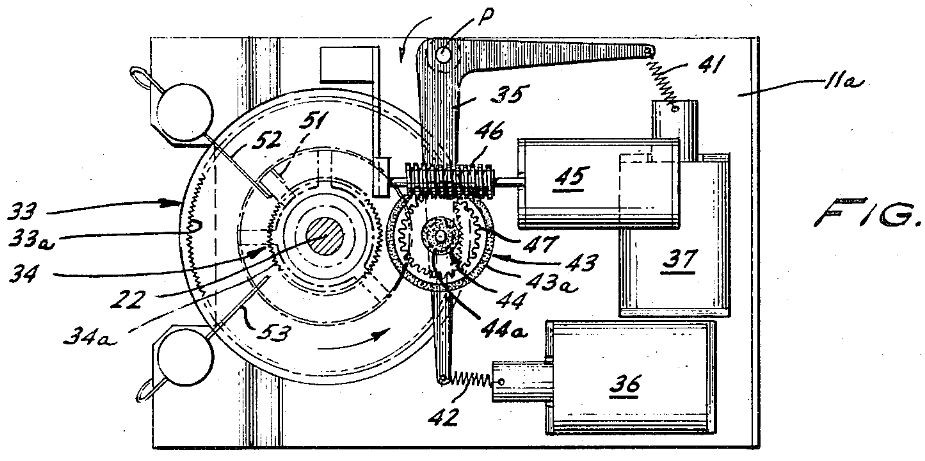
FIG. 3 is an elevational showing of the right hand portion of the apparatus seen in FIG. 2, looking generally in the direction of arrows 2—2 applied thereto, and showing an operational feature of the invention.
Figure 4:
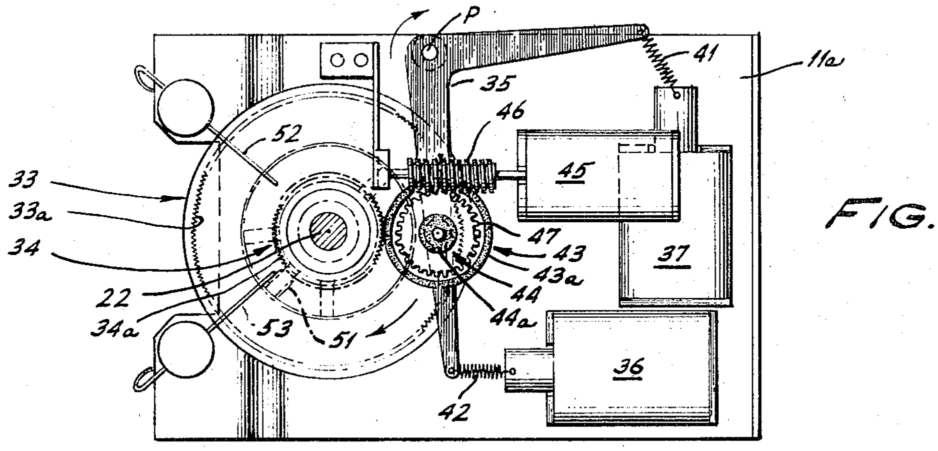
FIG. 4 is a view similar to FIG. 3, and illustrating a further operational feature.

In particular accordance with the invention, and with reference also to FIGS. 3 and 4, the end of tuner drive shaft 22 extending beyond clutch 31 is provided with a pair of concentric wheels, 33 and 34 of which wheel 34 is of lesser diameter than wheel 33. Wheel 33 includes a circumferential, axially presented flange defining a radially inwardly facing serrated frictional surface 33*a*. Wheel 34 includes a circumferential, radially outwardly facing serrated frictional surface 34*a*. A lever 35 is pivoted on frame portion 11*a* about a pivot P having an axis generally parallel to the axis of wheels 33 and 34, and a pair of solenoids 36 and 37 coupled with the lever 35, through springs 41, 42, are selectively energizable to rock the lever in one or the other direction. First and second drive wheels 43 and 44, the latter being of lesser diameter than the former, are concentrically journalled for rotation on lever 35, about an axis intermediate surfaces 33*a*, 34*a*, and are driven by a unidirectionally rotatable motor 45 through a worm 46 and a worm gear 47, the latter being keyed to wheels 43, 44. Each of wheels 43, 44 is provided with a friction tire 43*a*, 44*a*, respectively. Although it is clear from FIG. 2 that wheel 43 is larger than wheel 44, in the showings of FIGS. 3 and 4 the smaller wheel 44 has been shown in full, even though it is in fact hidden by wheel 43, in order to facilitate illustration of operation of the speed change and reversing apparatus.

Lever 35 and wheels 43, 44 are so cooperably disposed that when the lever is rocked in one direction (left hand arrow, FIG. 3), tire 44*a* of wheel 44 is moved into frictional driving engagement with flange 33*a* of driven wheel 33 of greater diameter, and when lever 35 is rocked in the other direction (right hand arrow, FIG. 4) tire 43*a* of wheel 43 is moved into frictional driving engagement with surface 34*a* of driven wheel 34 of lesser diameter. It will be appreciated that throughout the rocking movements of lever 35 the worm gear 47 remains meshed with and rolls along worm 46 a very short distance. It will be understood also that either manual or pushbutton operation of the tuner is accommodated by the neutral position of lever 35 shown in FIG. 2, in which position neither of wheels 43 or 44 is in driving engagement with wheels 33 or 34 on tuner shaft 22.

Further to the showings in FIGS. 2, 3, and 4, an electrically grounded limit switch arm 51 is affixed to tuner shaft 22 for rotation therewith. The tuner shaft 22 and switch arm 51 are rotatable through an angle of about 270° in the course of full scale tuning, i.e., movement of pointer L from one end of the dial M to the other (FIG. 1). Switch arm 51 is electrically engageable, at either end of its rotational travel, with a corresponding one of switch contacts 52 and 53 carried by and insulated from frame 11*a*.

Figure 5:
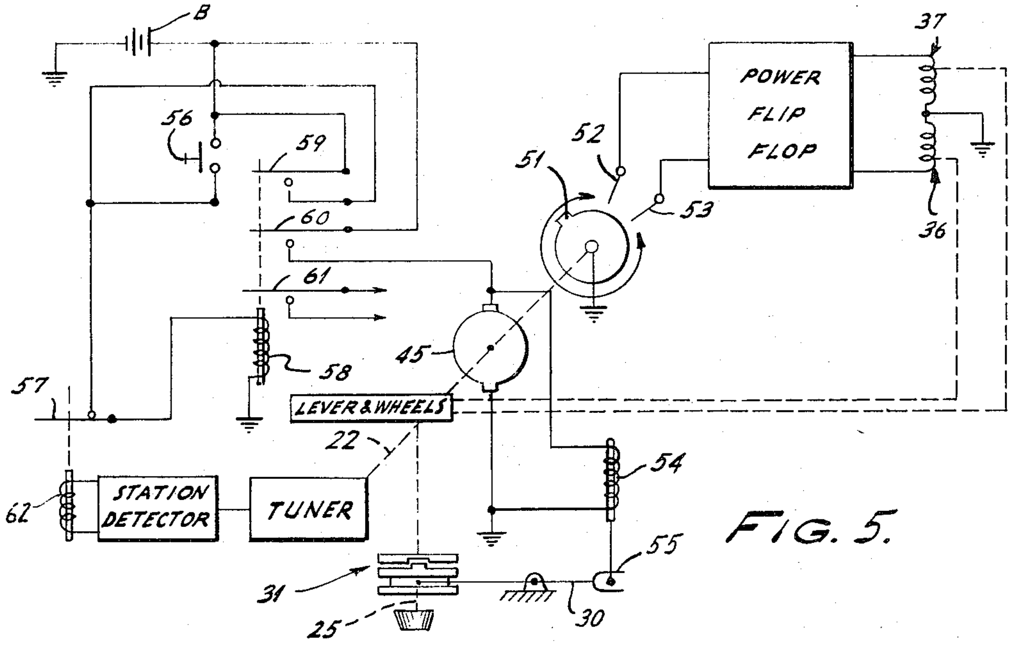
FIG. 5 is a diagrammatic showing of electrical control circuitry associated with the tuner and its drive.

With reference also to FIG. 5, clutch lever 30 is actuatable in the search tuning mode, to be described below, by a solenoid linked thereto through a pin-and-slot connection designated generally by the numeral 55 (see also FIG. 2). In provision of the search tuning mode of operation, one terminal of battery B is connected to a suitable ground, for example the frame of an automobile, and its other terminal is connected in series electrical circuit with a pushbutton switch 56, a relay switch 57, and one terminal of relay coil 58, the other terminal of which is grounded. A normally-open relay switch 59, operable by relay coil 58, is disposed in parallel electrical circuit with pushbutton switch 56. Also connected in series electrical circuit with battery B is a second normally-open relay switch 60 operated by coil 58, and one terminal of drive motor 45, the other terminal of which is grounded. Clutch solenoid 54 is disposed in parallel electrical circuit with motor 45, and a third normally-open relay switch 61 operated by coil 58 is connected to the receiver in known manner to serve as a muting switch. A station detector, as shown in FIG. 5, is operable in known manner, in association with the tuner, to energize and de-energize a relay coil 62 for operating normally-closed switch 57.

A Power Flip Flop of conventional design has each of its input terminals electrically connected to switch contacts 52 and 53, and its output terminals are electrically connected, as shown, to a terminal of each of lever-actuating solenoids 36 and 37, the other terminals of which are grounded.

In operation of the apparatus thus far described, and assuming it is desired to tune to the next strongest signal up-scale, switch 56 is closed momentarily, energizing relay coil 58 through normally closed relay switch 57. Energization of relay coil 58 closes normally open switches 59, 60, and 61. Closure of switch 59 maintains energization, i.e., locks-in, relay coil 58. Closure of switch 60 energizes motor 45 and clutch solenoid 54, the latter operation disengaging manual tuning knob and shaft assembly 25. Closure of switch 61 mutes the receiver. At the time of momentarily closing switch 56, limit switch arm will be in a position intermediate contacts 52 and 53, and the Power Flip Flop will be conditioned to energize tuning solenoid 36. As described hereinabove, and as seen in FIG. 3, energization of solenoid 36 rocks lever 35 in a left-hand direction urging tire portion 44*a* of slow-speed drive wheel 44 into driving engagement with the flanged inner surface of 33*a* of tuner friction drive wheel 33. As wheel 33 is driven, the tuner is operated up-scale until such time the Station Detector senses a strong signal, and operates to energize relay coil 61 and open relay switch 57. Opening of switch 57 de-energizes relay coil 58, thereby opening switches 59, 60, and 61. Opening of switch 60 de-energizes drive motor 45, accompanied by de-energization of clutch solenoid 54, and de-energization of the motor halts the tuner at the strong detected signal. The apparatus is then ready for its next search tuning operation as described.

Assuming, however, that no strong signal was detected, motor 45 will continue to drive the tuner at search-tuning speed until switch arm 51 engages switch contact 52. Engagement of arm 51 with contact 52 conditions the Power Flip Flop to de-energize solenoid 36 and energize solenoid 37, thereby rocking lever 35 in a right-hand direction (FIG. 4) to engage tire 43*a* of drive wheel 43 with drive surface 34*a* of tuner drive wheel 34, in provision of high speed repositioning of the tuner in a down-scale direction. Full repositioning of the tuner to the low end of the scale is accompanied by engagement of switch arm 51 with contact 53, whereby Power Flip Flop is conditioned to de-energize solenoid 37 and again energize solenoid 36 to rock lever 35 to the search tuning position shown in FIG. 3. The motor 45 will then continue to operate in provision of the search tuning mode as hereinabove described.

From the foregoing, it will be appreciated that the invention affords an improved search-tune drive mechanism featured by compactness and simplicity of construction, and by capability of ready assembly with tuning mechanism of known design. It will be understood also that, while the invention has been disclosed in conjunction with an AM receiver, it has utility also in conjunction with combination AM-FM receivers.

I claim:

1. In radio receiving apparatus of the type including adjustable means for tuning over a predetermined band of frequencies, improved drive means for moving said tuning means at a relatively slow rate for tuning in one direction and at a relatively rapid rate for repositioning in the opposite direction, said drive means comprising: driven wheel means drivingly coupled with said tuning means; a unidirectionally rotatable motor; a lever; means defining a pivot for said lever in provision for rocking movements thereof; first and second solenoid means coupled with said lever, each selectively energizable to rock said lever in one or the other direction; first and second drive wheel means, of different diameters, driven with said motor; said lever being operable, upon energization of said first solenoid means, to rock said lever in one direction to effect a coupling between said first drive wheel means and said driven wheel means in provision of the recited relatively slow drive rate of said tuning means, and, upon energization of said second solenoid means, to rock said lever in the other direction to effect a coupling between said second drive wheel means and said driven wheel means in provision of the recited relatively rapid drive rate of said tuning means.

2. Drive means according to claim 1, and characterized in that said driven wheel means includes a pair of concentrically rotatable wheels, one of lesser diameter than the other and both being rotatable to move said tuning means, said first and second drive wheel means being journalled for concentric rotation on said lever, said lever, when rocked in said one direction, moving said first drive wheel means into driving engagement with said driven wheel means of lesser diameter, and said lever, when rocked in said other direction, moving said second wheel means into driving engagement with said driven wheel means of greater diameter.

3. Drive means according to claim 2, and further characterized by the inclusion of a worm driven by said motor, and a worm gear concentric with and drivingly coupled with said first and second drive wheel means, said worm gear being drivingly meshed with said worm throughout the recited rocking movements of said lever.

4. Drive means according to claim 2, and further characterized in that said first drive wheel means is of lesser diameter than said second drive wheel means.

5. Drive means according to claim 3, and further characterized in that the recited driving engagement is frictional.

6. Drive means according to claim 5, and further characterized in that said driven wheel means of lesser diameter includes a circumferential, radially outwardly facing frictional surface, said driven wheel means of greater diameter includes a circumferential axially presented flange defining a radially inwardly facing frictional surface, and in that the common axis of said drive wheel means on said lever extends generally parallel to the common axis of said driven wheel means and through a region intermediate said inwardly facing and outwardly facing frictional surfaces.

7. Drive means according to claim 5, wherein the recited frictional driving engagement is afforded by serrated surfaces provided on each of said driven wheel means and by flexible and resilient tire means on each of said drive wheel means.

8. Drive means according to claim 6, wherein the recited frictional driving engagement is afforded by serrated surfaces provided on each of said driven wheel means and by flexible and resilient tire means on each of said drive wheel means.

9. For use with radio receiving apparatus of the type including adjustable means for tuning over a predetermined band of frequencies, and driven wheel means drivingly coupled with said tuning means, improved drive means for moving such tuning means at a relatively slow rate for tuning in one direction and at a relatively rapid rate for repositioning in the opposite direction, said drive means comprising: a unidirectionally rotatable motor; a lever; means defining a pivot for said lever in provision for rocking movements thereof; first and second solenoid means coupled with said lever, each selectively energizable to rock said lever in one or the other direction; said first and second drive wheel means, of different diameters, driven with said motor; said lever being operable, upon energization of said first solenoid means, to rock said lever in one direction to effect a coupling between said first drive wheel means and such driven wheel means in provision of the recited relatively slow drive rate of such tuning means, and, upon energization of said second solenoid means, to rock said lever in the other direction to effect a coupling between said second drive wheel means and such driven wheel means in provision of the recited relatively rapid drive rate of such tuning means.

10. Drive means according to claim 9, and characterized in that said first drive wheel means is of lesser diameter than said second drive wheel means, and said first and second drive wheel means are journalled for concentric rotation on said lever, said lever, when rocked in said one direction, moving said first drive wheel means into driving engagement with such driven wheel means, and said lever, when rocked in said other direction, moving said second wheel means into driving engagement with such driven wheel means.

11. Drive means according to claim 10, and further characterized by the inclusion of a worm driven by said motor, and a worm gear concentric with and drivingly coupled with said first and second drive wheel means, said worm gear being drivingly meshed with said worm throughout the recited rocking movements of said lever.

* * * * *